United States Patent [19]

Melzner et al.

[11] Patent Number: 5,774,414
[45] Date of Patent: Jun. 30, 1998

[54] MEMORY DEVICE AND PRODUCTION METHOD

[75] Inventors: Hanno Melzner, Unterhaching; Armin Kohlhase, Neubiberg, both of Germany

[73] Assignee: Siemens Aktiengesellschaft, Munich, Germany

[21] Appl. No.: 694,531

[22] Filed: Aug. 9, 1996

[30] Foreign Application Priority Data

Aug. 9, 1995 [EP] European Pat. Off. ......... 95 112 547.5

[51] Int. Cl.$^6$ ...................................................... G11C 7/00
[52] U.S. Cl. .......................... 365/244; 365/174; 365/149
[58] Field of Search .................................. 365/244, 149, 365/186, 174, 176

[56] References Cited

U.S. PATENT DOCUMENTS

| | | | |
|---|---|---|---|
| 3,970,887 | 7/1976 | Smith et al. | 313/309 |
| 4,979,149 | 12/1990 | Popovic et al. | 365/244 |
| 5,216,631 | 6/1993 | Sliwa, Jr. | 365/174 |

FOREIGN PATENT DOCUMENTS 0259614  3/1988  European Pat. Off. .

OTHER PUBLICATIONS

"Field Ablation Storage Device", IBM Technical Disclosure Bulletin, Apr. 1983, vol. 25, No. 11B, pp. 5874–5875.
"Bistable Micromechanical Storage Element in Silicon", K.E. Petersen, IBM Corp. 1978.

Primary Examiner—David C. Nelms
Assistant Examiner—Vu A. Le
Attorney, Agent, or Firm—Laurence A. Greenberg; Herbert L. Lerner

[57] ABSTRACT

A memory device includes a multiplicity of memory cells disposed on a substrate for at least intermittent stable storage of at least two different information states. A writing device is associated with the memory cells for selectively putting one of the multiplicity of memory cells into a predetermined information state by external action. A reading device is associated with the memory cells for external detection of a current or chronologically preceding information state of a selected memory cell. The memory cells have a miniaturized mechanical element. The production of such a memory device is performed with the following steps: full-surface application of a first insulator layer onto a main surface of a substrate; full-surface application of a diaphragm layer being formed of an electrically conductive material onto the first insulator layer; structuring of the diaphragm layer in such a way that first conductor tracks are formed, which have enlargements at points of the memory cells; isotropic etching of the first insulator layer, using the structured diaphragm layer as an etching mask, until such time as a sharp point remains behind in the middle, immediately beneath the enlargement; and removal of all of the material of the fist insulator layer on the underside of the enlargement, thus forming a diaphragm.

57 Claims, 5 Drawing Sheets

ENERGY EXCESS (→ IMPACT ENERGY)

$$= \frac{1}{2} \varepsilon_0 \cdot \frac{U^2}{d^2} b \cdot l \cdot \alpha_0$$

1. CASE
2. CASE

STATIC
DYNAMIC

TOTAL ENERGY

SECONDARY MINIMUM

POSITION OF REPOSE

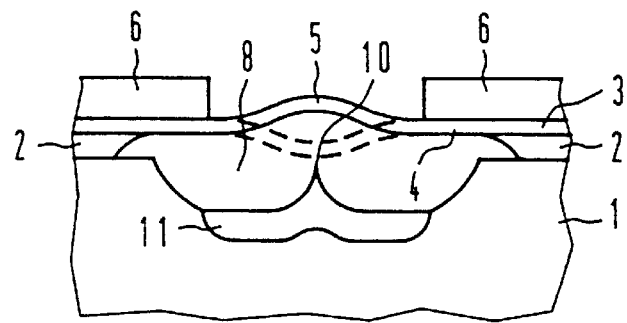
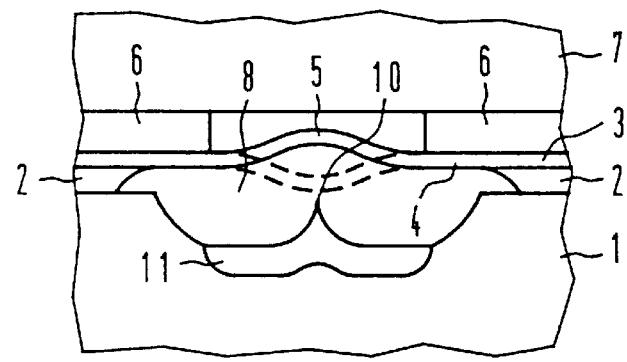
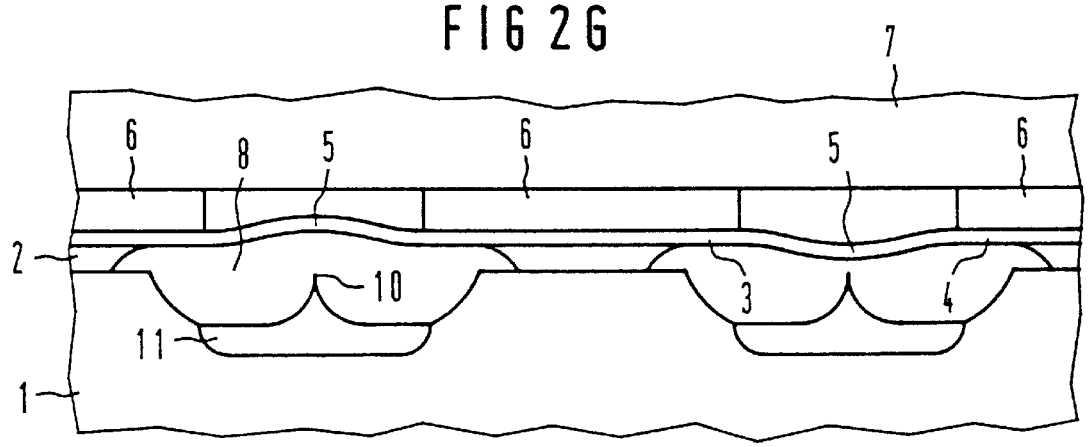

MEMORY DEVICE AND PRODUCTION METHOD

BACKGROUND OF THE INVENTION

FIELD OF THE INVENTION

The invention relates to a memory device having a multiplicity of memory cells disposed on a substrate for at least intermittent stable storage of at least two different information states, a writing device associated with the memory cells for selectively putting one of the multiplicity of memory cells into a predetermined information state by external action, and a reading device associated with the memory cells for external detection of a current or chronologically preceding information state of a selected memory cell. The invention also relates to a method for producing a memory device, a method for reading out the data contents from the memory cells of a memory device, and a method for writing the data contents into the memory cells of a memory device.

Many electronic systems need memories in which data can be written and read out in digital form. Such memories are well known, among others, in the form of semiconductor read only memories (ROM's), dynamic random access semiconductor memories (DDRAMs), and the like.

Where there are very large amounts of data, plastic disks coated with aluminum are also often used as electronic memories. In the coating, those plastic disks have two types of dotlike indentations that are associated with the logical values of 0 and 1. The information is digitally stored in the configuration of those indentations. Such disks are known as compact disks and are widely used, among other purposes for digitally storing music in memory.

SUMMARY OF THE INVENTION

It is accordingly an object of the invention to provide a memory device and a production method, which overcome the hereinafore-mentioned disadvantages of the heretofore-known devices and methods of this general type, in which the memory device is of an entirely novel kind that enables the storage of considerable amounts of data and is structurally simpler than previously known types of electronic or electrooptical memory devices, and in which not only the method for producing such a memory device but also a method for reading out data contents from memory cells of such a memory device and a method for writing the data contents into the memory cells of such a memory device are provided.

With the foregoing and other objects in view there is provided, in accordance with the invention, a memory device, comprising a substrate; a multiplicity of memory cells disposed on the substrate for at least intermittent stable storage of at least two different information states; a writing device associated with the memory cells for selectively putting one of the multiplicity of memory cells into a predetermined information state by external action; and a reading device associated with the memory cells for external detection of a present or chronologically preceding information state of a selected memory cell; the memory cells having a miniaturized mechanical element with a micromechanical diaphragm being under a compressive stress.

According to one embodiment, the reading device associated with the memory cells has a field emissions point disposed at a given distance from the diaphragm.

According to another embodiment, the diaphragm is under a pneumatic force acting upon the diaphragm for changing the information states from one to another.

According to a further embodiment, the reading device associated with the memory cells has a device for detecting the light interference of a beam of light between the diaphragm and a stationary surface and/or a device for detecting an interruption in a beam of light passing through the diaphragm and/or a device for adjusting a micromirror associated with a beam of light of the diaphragm.

According to the invention, the memory cells have a miniaturized mechanical element. In particular, the miniaturized mechanical element is a thin, micromechanically produced diaphragm, which is supported or fastened on one or more sides and has flexing or oscillation or deflection events that are detected and varied.

In recent years, microelectronics has increasingly been supplemented by micromechanics. The physical fundamentals, the technology of micromechanics, and the previously known use of micromechanics in applications with corresponding basic structures and elements of micromechanics and applications of micromechanical components can all be learned from the book entitled: Mikromechanik [Micromechanics] by A. Heuberger (Editor), 1989, the contents of which are hereby entirely incorporated by reference.

The invention proposes expansion of the field of information storage, previously reserved to electronics, to the use of the methods of micromechanics.

The basis for the information storage according to the invention is a bistable or multistable system, that is a system which for at least some time remains stable in two or optionally even more states. In electronics, an example thereof is a flip-flop, and one memory based thereon is a static semiconductor random access memory (known as SRAM). By external action, such a system must be capable of being put into one of the two or more states (writing), and it must be ascertainable from outside what state the system is in (reading) or was in immediately prior to the reading (destructive reading).

In accordance with another feature of the invention, the purely mechanical bistable (or multistable) element for the memory cells is a diaphragm that is under a compressive stress. Such a diaphragm will seek to reduce the compressive stress by bending. In other words, it will flex upward or downward. These two bistable states of the diaphragm (flexed upward or downward) are stable and can be converted to one another only by the exertion of a force.

In accordance with a further feature of the invention, the force acting on the diaphragm for converting the various information states of the memory cell to one another is an electrostatic force. In small-sized elements, electrostatic forces are excellently suitable and are already frequently used in micromechanics. It will be estimated below by calculation that a micromechanical diaphragm can be switched with a voltage on the order of magnitude of 10 V. Upon farther linear reduction, the requisite writing voltage drops linearly. The aforementioned estimate applies initially to a square diaphragm. The requisite writing voltage can be further reduced by a suitable, possibly more-complicated shape of the diaphragm.

In accordance with an added feature of the invention, the force to be exerted on the diaphragm of the memory cell is a pneumatic force. The diaphragm may be mounted above a gas-filled hollow chamber that is closed on all sides, through the use of which the diaphragm is pneumatically actuated. The diaphragm can be purposefully changed from the lower to the upper position, for instance by heating a gas volume with a laser. From the calculation below it can be learned that the pressure in pneumatic actuation must be on the order of magnitude of 1 at. This pressure can be attained by heating to a few hundred degrees Celsius. A switchover of an individual diaphragm from the upper to the lower position is not possible in this version. However, all of the memory cells of a memory array can be brought to the lower position (erasure of the memory device) and subsequently rewritten by placing them in a pressure chamber or the like.

Various possibilities exist in the memory device of the invention for readout of the data contents stored in the memory cells with miniaturized mechanical elements for the memory cells.

One possibility is to read the data contents out optically. In this case a number of effects can be effectively exploited: In a preferred version of the invention, the reading device associated w ith the memory cells detects t he light interference of a beam of light between the diaphragm and a stationary surface. Moreover, or as an alternative, it may be provided that the reading device detects an interruption of a beam of light passing through the diaphragm, or adjusts a micromirror associated with a beam of light of the diaphragm.

In accordance with an additional feature of the invention, the data is read out of the memory cells of the memory device of the invention through the use of electromechanical reading. The reading device associated with the memory cells of the memory device may have an electromechanical switch that is switched by the diaphragm itself or by a switch element, for instance a miniaturized relay associated with the diaphragm, as a function of the states of the diaphragm. Thus the diaphragm itself, or an element secured to the diaphragm, switches an electrical contact on and off depending on the position of the diaphragm.

In accordance with yet another feature of the invention, the readout of the data from the memory cells of the memory device is carried out electronically. One way to do this is for the capacitance between the diaphragm and a stationary surface, which varies as a function of the position of the diaphragm, to be detected and evaluated.

In accordance with yet a further feature of the invention, the reading device associated with the memory cells has a transistor with a control terminal that is associated with the diaphragm and/or forms the diaphragm. In this case the diaphragm acts as a gate or control terminal of the transistor, which is preferably an MOS transistor. Depending on the spacing of the diaphragm from the semiconductor surface of the transistor, the electrical field at the surface varies, and the conductivity of the channel of the transistor is varied.

In accordance with yet an added feature of the invention, the reading device associated with the memory cells has a field emissions point disposed at a certain distance from the diaphragm for readout of the data from the memory cell. Especially when small dimensions are involved, high fields occur even at moderate voltages. This effect makes it possible among other things to build miniaturized "tubes" with field emission cathodes. If the spacing of the diaphragm from an emission point varies, then the conductivity from the point to the diaphragm changes, which can be used to read the data out of the memory cells.

With the objects of the invention in view there is also provided a method for producing a memory device including a multiplicity of memory cells having a miniaturized mechanical element, which comprises applying a first insulator layer entirely over a main surface of a substrate; applying a diaphragm layer formed of an electrically conductive material entirely over the first insulator layer; structuring the diaphragm layer to form first conductor tracks having enlargements at points of memory cells; isotropically etching the first insulator layer using the structured diaphragm layer as an etching mask, until a sharp point remains behind centrally, immediately beneath the enlargements; and removing all of the material of the fist insulator layer on a lower surface of the enlargements to form a diaphragm.

In accordance with another mode of the invention, trenches are etched in the first insulator layer crosswise to the first conductor tracks, with the diaphragms acting as an etching stop agent.

In accordance with a further mode of the invention, a second conductor track is produced on the bottom of the trench.

In accordance with an added mode of the invention, the second conductor track produced on the bottom of the trench is generated through the use of an implantation step performed partway through the thin diaphragm.

In accordance with an additional mode of the invention, a counterpart plate is applied for air-tight sealing of the trenches.

With the objects of the invention in view there is additionally provided a method for reading out data contents from memory cells of a memory device, the memory cells having a miniaturized mechanical element and being located at intersections of word lines and bit lines, which comprises selecting one word line and one bit line; and measuring electrical resistance of the selected word line with respect to the selected bit line.

In accordance with another mode of the invention, the step of the measurement of the electrical resistance of the selected word line with respect to the selected bit line has a step of comparing the measured electrical resistance with the electrical resistance of a reference memory cell having a predetermined switching state.

With the objects of the invention in view there is furthermore provided a method for writing data contents into memory cells of a memory device, the memory cells having a miniaturized mechanical element and being located at intersections of word lines and bit lines, which comprises:

selecting one word line and one bit line; and exerting a force on a miniaturized mechanical element of the selected word line and the selected bit line.

In accordance with a concomitant mode of the invention, the force acting on the miniaturized mechanical element is selected from the group consisting of an electrostatic, a magnetic and a pneumatic force.

Other features which are considered as characteristic for the invention are set forth in the appended claims.

Although the invention is illustrated and described herein as embodied in a memory device and a production method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 2A–2G are fragmentary, diagrammatic views used to explain the production of a memory device with miniaturized mechanical elements in accordance with one exemplary embodiment of the invention.

DESCRIPTION OF THE PREFERRED EMBODIMENTS

Referring now to the figures of the drawings in detail and first, particularly, to FIGS. 1A–1G thereof, initially properties of a thin diaphragm which is fastened at two edges thereof will be investigated in further detail below, using a simple calculation.

In the case of the Fourier representation of a diaphragm of length L deflected by a distance x, the following equation applies:

$$f(x) = \frac{\alpha}{2}\left(1 - \cos\left(\frac{x}{L} \cdot 2\pi\right)\right) + \beta\left(\sin\left(\frac{x}{L} \cdot 2\pi\right) - \frac{1}{2}\sin\left(\frac{x}{L} \cdot 2\pi\right)\right)$$

The Fourier coefficients $\alpha$ and $\beta$ are ascertained from peripheral conditions, as follows:

$f(0) = f(L) = 0$
$f'(0) = f'(L) = 0$

In the case of the deflection in the middle of the diaphragm, that is where $x = L/2$, the following equation applies:

$$f\left(\frac{L}{2}\right) = \alpha$$

Ascertaining $\beta(\alpha)$ can be carried out from the following condition: length of the diaphragm = $L + \Delta$ = constant.

$$\int_0^L \sqrt{1 + f'^2(x)}\, dx \approx \int_0^L \left(1 + \frac{1}{2} f'^2(x)\right) dx \text{ (for small deflections)}$$

and therefore:

$$= L + \frac{1}{2} \int f'^2(x)dx$$

Let $$X = \frac{x}{L} \cdot 2\pi;$$

then the following equation applies:

$$f'(x) = \frac{2\pi}{L}\, \frac{\alpha}{2}\sin X + \beta\frac{2\pi}{L}\cos X - \frac{1}{2}\beta\frac{4\pi}{L}\cos 2X$$

Due to the orthogonalism, it follows that:

$$\int_0^L f'^2(x)dx = \left(\frac{2\pi}{L}\, \frac{\alpha}{2}\right)^2 \frac{L}{2} +$$

$$\left(\beta\frac{2\pi}{L}\right)^2 \frac{L}{2} + \left(\beta\frac{2\pi}{L}\right)^2 \frac{L}{2} =$$

$$\frac{L}{2}\left(\frac{2\pi}{L}\right)^2\left(\frac{\alpha^2}{4} + 2\beta^2\right) = \frac{4\pi^2}{L}\left(\frac{\alpha^2}{8} + \beta^2\right)\Delta =$$

$$\frac{1}{2}\int_0^L f'^2(x)dx = \frac{2\pi^2}{L}\left(\frac{\alpha^2}{8} + \beta^2\right)$$

Figure 1A:
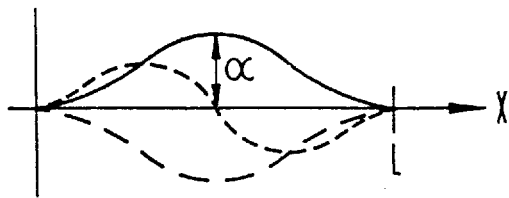
FIGS. 1A–1G are diagrams for estimating a voltage required to switch a micromechanical diaphragm.
Figure 1B:
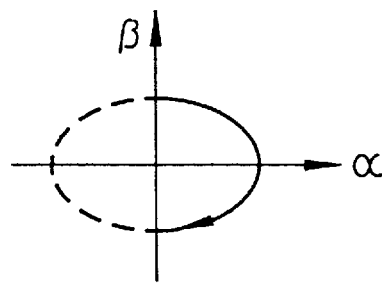
Figure 1C:
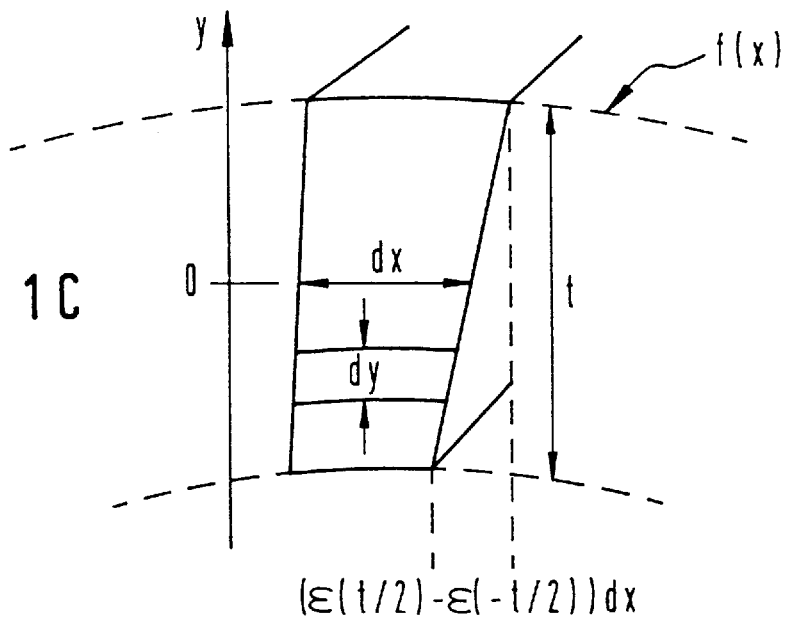
Figure 1D:
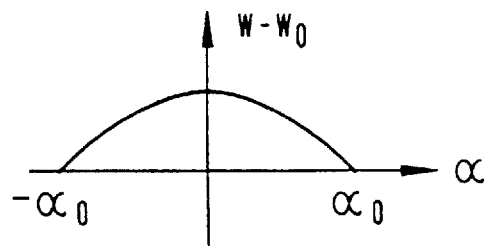
Figure 1E:
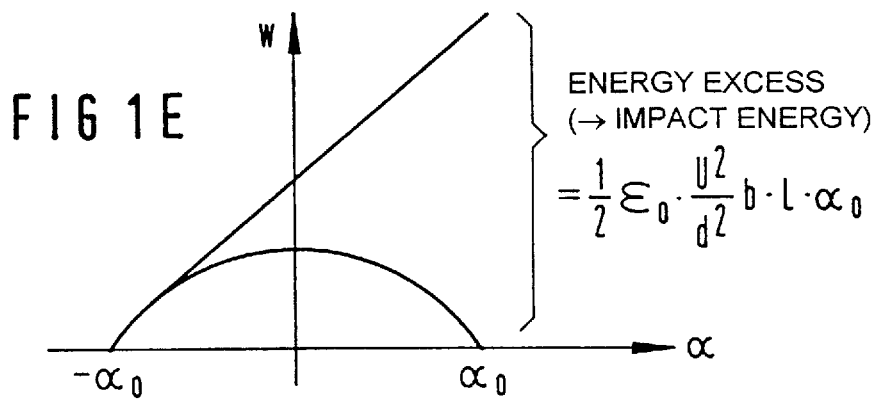
Figure 1F:
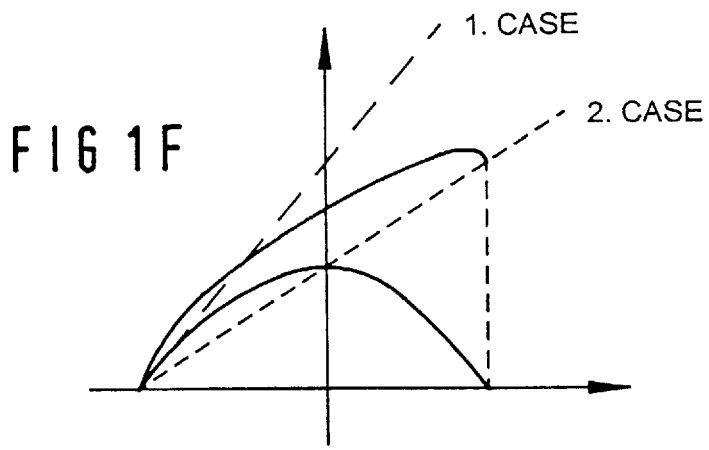
Figure 1G:
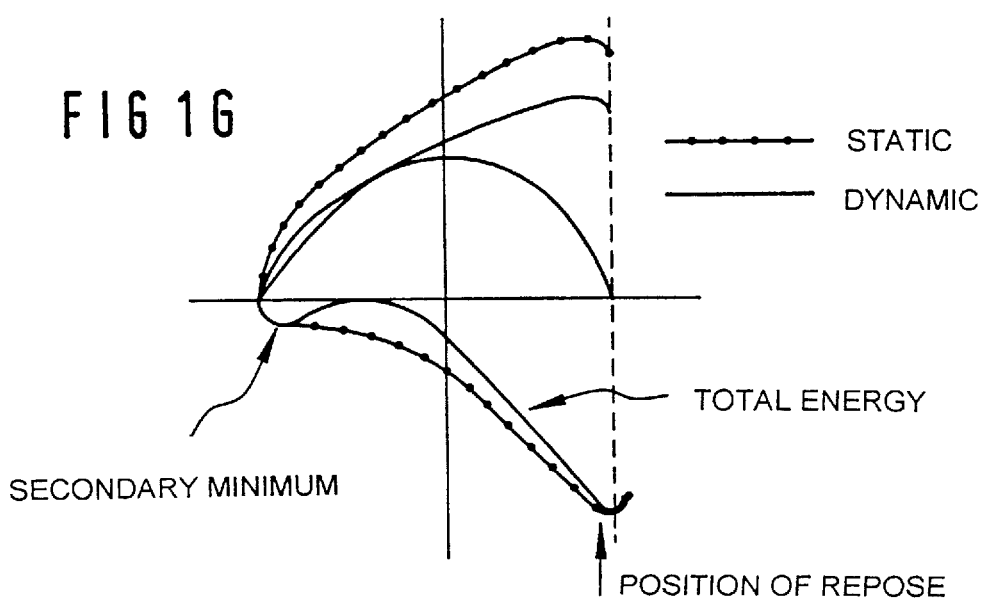

(see FIG. 1B)

$$\Delta \text{ constant: } \beta = \pm\sqrt{\frac{\Delta \cdot L}{2\pi^2} - \frac{\alpha^2}{8}}$$

and in the basic state: $\beta = 0$, thus yielding:

$$\frac{\alpha_0^2}{8} = \frac{L \cdot \Delta}{2\pi^2} \rightarrow \beta = \pm\sqrt{\frac{\alpha_0^2}{8} - \frac{\alpha^2}{8}} = \pm\frac{\sqrt{2}}{4}\sqrt{\alpha_0^2 - \alpha^2}$$

and $\alpha_0 = \sqrt{\frac{4L \cdot \Delta}{\pi^2}} = \frac{2}{\pi}\sqrt{L\Delta}$ In the case of the energy content of a diaphragm piece, the following is true, with reference to the diagram of FIG. 1C:

$\epsilon \sim y$ $\delta \sim y$ $$\frac{\left(\epsilon\left(\frac{t}{2}\right) - \epsilon\left(-\frac{t}{2}\right)\right) \cdot dx}{t \cdot dx} = f''(x) \Rightarrow$$

$\epsilon = f''(x) \cdot y \Rightarrow$ $$\delta = \frac{E}{1-\mu}\, \epsilon = \frac{E}{1-\mu} f''(x) \cdot y$$

Thus it follows for the force of a volumetric element (in which the width of the diaphragm is b) that:

$$F = \delta \cdot dy \cdot b = \frac{E}{1-\mu} dy \cdot b \cdot \epsilon$$

Displacement element: $d\epsilon \cdot dx$

Thus the energy content in the volumetric element is:

$$W_{dx/dy} = \frac{E}{1-\mu} dy \cdot b \cdot dx \cdot \int_0^{\epsilon(y)} \epsilon\, d\epsilon = \frac{E}{1-\mu} dxdyb\frac{1}{2}(\epsilon(y))^2 =$$

$$\frac{1}{2}\, \frac{E}{1-\mu} dxdybf''^2(x)y^2$$

and for the energy content in the diaphragm piece that:

$$W_{dx} = \int_{-\frac{t}{2}}^{\frac{t}{2}} W_{dx/dy} = \frac{1}{2}\, \frac{E}{1-\mu} dx \cdot b \cdot f''^2(x) \int_{-\frac{t}{2}}^{\frac{t}{2}} y^2 dy =$$

$$\frac{1}{2}\, \frac{E}{1-\mu} dx \cdot b \cdot f''^2(x)\frac{1}{3} \cdot 2 \cdot \frac{t^3}{8} = \frac{1}{24}\, \frac{E}{1-\mu} bt^3 dxf''^2(x)$$

The energy content in the diaphragm is calculated as follows:

$$W = \int_0^L W_{dx} = \frac{1}{24} \frac{E}{1-\mu} bt^3 \int_0^L f''^2(x)dx$$

Let $X = \frac{x}{L} \cdot 2\pi$, then:

$$f''(x) = \left(\frac{2\pi}{L}\right)^2 \frac{\alpha}{2} \cos X - \beta \left(\frac{2\pi}{L}\right)^2 \sin X + \frac{\beta}{2} \left(\frac{4\pi}{L}\right)^2 \sin 2X$$

Due to the orthogonalism:

$$\int_0^L f''^2(x)dx = \left(\frac{2\pi}{L}\right)^4 \left(\frac{\alpha}{2}\right)^2 \frac{L}{2} + \left(\frac{2\pi}{L}\right)^4 \beta^2 \frac{L}{2} + \left(\frac{\beta}{2}\right)^2 \left(\frac{4\pi}{L}\right)^4 \frac{L}{2} = \frac{\pi^4}{L^3}(2\alpha^2 + 8\beta^2 + 32\beta^2) = \frac{2\pi^4}{L^3}(\alpha^2 + 20\beta^2)$$

From the length condition:

$$\beta^2 = \frac{1}{8}(\alpha_0^2 - \alpha^2)$$

it follows that:

$$\int_0^L f''^2(x)dx = \frac{\pi^4}{L^3}(2\alpha^2 + 5\alpha_0^2 - 5\alpha^2) = \frac{\pi^4}{L^3}(5\alpha_0^2 - 3\alpha^2)$$

and therefore:

$$W = \frac{1}{24} \frac{E}{1-\mu} bt^3 \frac{\pi^4}{L^3}(5\alpha_0^2 - 3\alpha^2)$$

$W_0$ in the basic state: $\alpha = \pm\alpha_0$ $$W_0 = \frac{1}{12} \frac{E}{1-\mu} bt^3 \frac{\pi^4}{L^3} \cdot \alpha_0^2$$

The energy relative to the basic state is thus found to be (see FIG. 1D):

$$W - W_0 = \frac{1}{8} \frac{E}{1-\mu} bt^3 \frac{\pi^4}{L^3}(\alpha_0^2 - \alpha^2)$$

In the following observation, the diaphragm will be considered to be a plate capacitor.
Start in the lower position of repose
Let $$X = \frac{x}{L} \cdot 2\pi$$

$$f_0(x) = -\frac{\alpha_0}{2}(1 - \cos X)$$

$$f(x) = \frac{\alpha}{2}(1 - \cos X) + \frac{\sqrt{2}}{4}\sqrt{\alpha_0^2 - \alpha^2}\left(\sin X - \frac{1}{2}\sin 2X\right)$$

On deflection, the distance traveled by a diaphragm element is:

$$s(x) = f(x) - f_0(x) = \frac{\alpha + \alpha_0}{2}(1 - \cos X) + \frac{\sqrt{2}}{4}\sqrt{\alpha_0^2 - \alpha^2}\left(\sin X - \frac{1}{2}\sin 2X\right)$$

and the result, for the force on a diaphragm (dx·b) in the plate capacitor is:

$$F = \frac{1}{2}\epsilon_0 \frac{U^2}{d^2} dx \cdot b \quad (\text{in which } d \gg \text{deflection})$$

The energy absorbed in the deflection is calculated as:

$$W = \int_0^{L(L/2)} F \cdot s(x)dx$$

Below, two cases can be distinguished:
First Case: Entire diaphragm in the capacitor $$\int_0^L s(x)dx = \frac{L}{2}(\alpha + \alpha_0)$$

(all of the other summations periodically $\to \int = 0$)

$$W = \frac{1}{2}\epsilon_0 \frac{U^2}{d^2} \cdot b \cdot \frac{L}{2}(\alpha + \alpha_0) = \frac{U^2}{4d^2}\epsilon_0 bL(\alpha + \alpha_0)$$

$$\text{Energy excess} = \frac{1}{2}\epsilon_0 \frac{U^2}{d^2} bL\alpha_0 \quad (\text{see FIG. 1E})$$

The switching operation ensues once the slopes are the same, at $-\alpha_0$.

Slope of potential energy:

$$\frac{1}{4}\frac{E}{1-\mu} bt^3 \frac{\pi^4}{L^3}\alpha_0$$

Slope of electrical energy:

$$\frac{1}{4}\epsilon_0 \frac{U^2}{d^2} bL$$

$$\frac{E}{1-\mu} t^3 \frac{\pi^4}{L^3}\alpha_0 = \epsilon_0 \frac{U^2}{d^2} L \to$$

$$U = \frac{d\pi^2}{L^2}\sqrt{\frac{E}{1-\mu} t^3 \frac{\alpha_0}{\epsilon_0}}$$

Thus for the following example:

Si-diaphragm, that is $E/(1-\mu) = 184 \cdot 10^9 \, N/m^2$.

$t = 10$ nm $d = 100$ nm $L = 1 \, \mu m$ $\alpha_0 = 20$ nm $\epsilon_0 = 8.85 \cdot 10^{-12} \, As/Vm \to U = 20$ V Second case: Half diaphragm in the plate capacitor $$\int_0^{L/2} s(x)dx = \left[ (\alpha + \alpha_0)\frac{x}{2} - (\alpha + \alpha_0)\frac{L}{4\pi} \sin X - \sqrt{\alpha_0^2 - \alpha^2} \left( \frac{L}{2\pi} \cos X - \frac{L}{8\pi} \cos 2X \right) \right]_0^{L/2} =$$

$$\frac{L}{4}(\alpha + \alpha_0) + \frac{L\sqrt{2}}{4\pi}\sqrt{\alpha_0^2 - \alpha^2} =$$

$$\frac{L}{4}\left(\alpha + \alpha_0 + \frac{\sqrt{2}}{\pi}\sqrt{\alpha_0^2 - \alpha^2}\right)$$

$$W = \frac{\epsilon_0 bL}{8} \frac{U^2}{d^2} \left( \alpha + \alpha_0 + \frac{\sqrt{2}}{\pi}\sqrt{\alpha_0^2 - \alpha^2} \right)$$

There are two subcategories of cases (see FIG. 1F):

Static switching

For each displacement segment, energy gain>energy loss; total energy drops monotonously. Force on diaphragm always positive; switches even upon damping.

Dynamic switching

Cumulative energy gain>cumulative energy loss. Diaphragm requires kinetic energy to overcome energy minimums. Upon damping, diaphragm remains at secondary minimums (see FIG. 1G).

The requisite voltage in this case is somewhat less than in the first case (entire diaphragm in plate capacitor).

Thus a rough estimate of the switching time (writing time) can be given as follows:

Force on diaphragm $F \approx \frac{1}{2} \epsilon_0 \frac{U^2}{d^2} Lb$

Mass of the diaphragm $m = tbL\rho$

Acceleration of the diaphragm $a = \frac{1}{2} \frac{\epsilon_0}{t\rho} \frac{U^2}{d^2}$ Displacement $s = \frac{1}{2} a\tau^2 \rightarrow 2\alpha_0$ $\tau = 2\sqrt{\frac{\alpha_0}{a}} = \frac{2d}{U}\sqrt{\alpha_0 \frac{2t\rho}{\epsilon_0}}$ Where $\rho = 3000$ kg/m$^3$ → $\tau = 3.7$ ns $a = 5.9 \cdot 10^9$ m/s$^2$ $U = 20$ V   dimension as above (that is external vibration negligible).

Scaling of dimensions:   $U \sim$ linear dimension (for instance, half size --> half voltage).

Upon a pneumatic actuation of the diaphragm, the following applies:

Force on diaphragm element:

$F = p \, dx \cdot b$ $W = \frac{1}{2} pbL(\alpha + \alpha_0)$

Slope = $1/2 \, pbL$ $\frac{1}{2} \frac{E}{1-\mu} bt^3 \frac{\pi^4}{L^3} \alpha_0 = \frac{1}{2} pbL$ $p = \frac{1}{2} \frac{E}{1-\mu} t^3 \frac{\pi^4}{L^4} \alpha_0$ Example (dimensions as above): p=180,000 N/m$^2$ ≈1.8 bar. Dimensional scaling p independent of scaling factor (!).

FIGS. 2A–2G show the course of the method for producing a memory device in accordance with one exemplary embodiment of the invention. In the diagrammatic sectional view of FIG. 2A, there is seen a first insulator layer 2 with a thickness of about 50 nm that is first applied over the entire surface of a suitable first carrier or substrate 1. Next, a diaphragm layer 3 of electrically conductive material is applied over the entire surface of the insulator layer 2, and it is from this that the diaphragm of the memory cell will later be formed. The diaphragm layer 3 has a thickness of 10 nm, for instance.

Figure 2A:
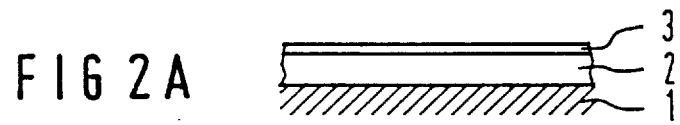
Figure 2B:
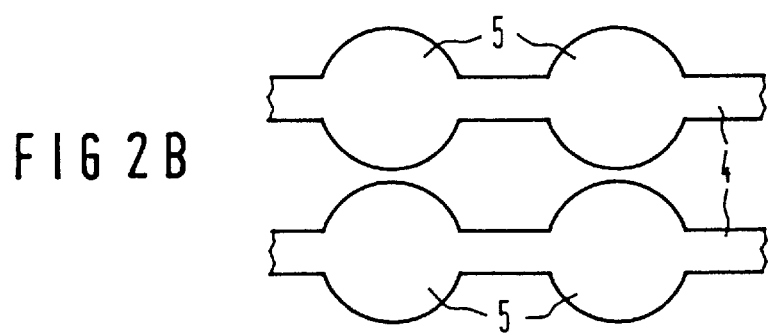

Next, the electrically conductive diaphragm layer 3 is structured by lithography and etching steps, in such a way that many first conductor tracks 4, which are located side by side and are electrically insulated from one another, are produced as is seen in FIG. 2B. The conductor tracks 4 have enlargements 5 that may, for instance, have a circular area at the locations of the later memory cells, as can be seen from the diagrammatic plan view of FIG. 2B. The conductor tracks 4 act as word lines for the selective choice of one row of memory cells.

Figure 2C:
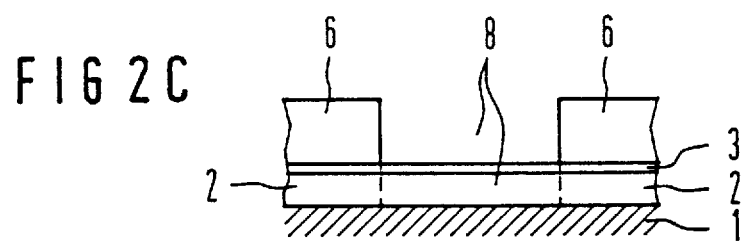

Next, as is seen in the diagrammatic sectional view of FIG. 2C, a second insulator layer 6 with a thickness of about 100 nm, for instance, is applied and optionally fully planeground, for instance through the use of a CMP process that is known per se, to enable a later hermetic adhesive bonding to a second substrate 7 or wafer seen in FIG. 2F. Trenches 8 are etched perpendicular to the word lines 4 into the two insulator layers 2 and 6 and the enlargements 5 (the later diaphragms) act as etching stop agents.

Figure 2D:
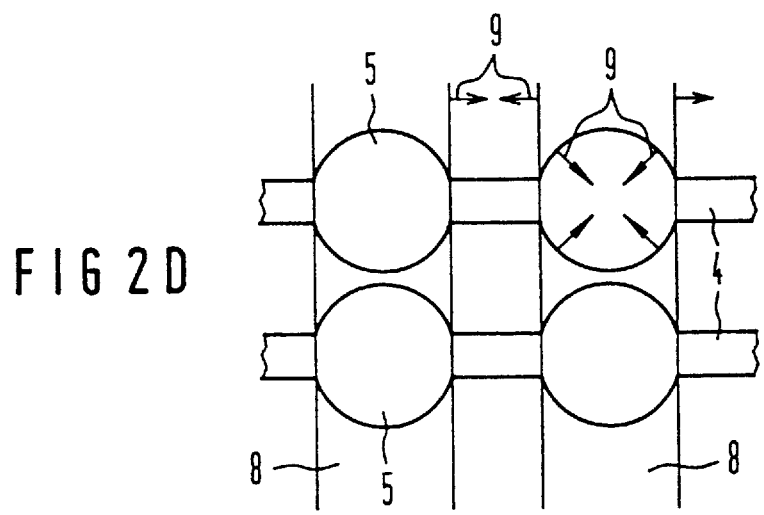

Next, the substrate 1 is etched isotropically, as is shown in the diagrammatic plan view of FIG. 2D. Arrows 9 in this drawing figure indicate the direction of the underetching. Etched edges that form in the isotropic etching will meet in the middle under the enlargement 5 of the diaphragm, leaving behind a sharp point 10 as is shown in FIG. 2E.

The electrostatic properties of such field emitter points are described at length, for instance in the keynote address by Takao Utsumi, entitled "Vacuum Microelectronics: What's New and Exciting", in IEEE TRANSACTIONS ON ELECTRON DEVICES, Vol. 38, No. 10, October 1991, from which these properties of the field emission points can be learned. The content of that paper is hereby entirely incorporated herein by reference.

After the point 10 has been formed, the isotropic substrate etching is ended, and the first insulator layer 2 is overetched isotropically to such an extent that all of the material of the insulator layer 2 is removed from the underside of the diaphragm. Next, through the use of an implantation that is carried out partially through the thin diaphragm, a second conductor track 11 is made on the bottom of the trench 8 for bit lines that extend crosswise to the word lines (see the diagrammatic sectional view of FIG. 2E).

Next, as is shown in FIG. 2F, the second wafer 7 is glued on and it forms a counterelectrode (ground) and at the same time seals the trenches 8 in an air-tight manner. In this way, the configuration of a memory device according to the invention which is shown in detail in the sectional view of FIG. 2G is obtained.

The full course of actual production of the memory device of the invention requires two mask planes, although under some circumstances, for integration of triggering logic, which is not shown in detail, additional mask planes are necessary.

The operations required to read and write a data content in a selected memory cell will now be described in detail with reference to FIGS. 3A–3G.

For reading, the electrical resistance of a word line to a bit line is simply measured and preferably compared with the electrical resistance of a reference cell of a known switching state in the vicinity of the selected cell, to compensate for local fluctuations in geometry. In the reading operation, the word line is positive relative to the bit line, because of the field emission.

The writing operation can be carried out as follows, with reference to FIGS. 3A–3G. It is assumed that an upper electrode 12 of the memory cell is at a voltage U which is 0; all of the nonactive bit lines are likewise at 0; and all of the nonactive word lines are at U/2. The active bit line is at U, and the active word line is at either 0 or U, depending on the desired switching operation. Accordingly, in FIG. 3A there are a total of six situations, numbered #1 through #6. A net force is exerted only on the cell diaphragm located at the intersection of the active lines. The geometry can be approximated through the use of two plate capacitors. Small field forces on unaddressed diaphragms are harmless, since a certain minimum force is necessary for switching. The polarity of the voltage U should be chosen to be positive, so that no field emission will occur in the writing process. The geometry should be selected in such a way that the reading voltage is lower that the writing voltage, to prevent unintentional switching.

Situations #1 through #6 are each described in further detail below in conjunction with FIGS. 3B–3G. The dashed lines indicate a course of an electrostatic field 13 acting on the diaphragm. The arrows each indicate the direction of the force acting on the diaphragm.

Figure 3A:
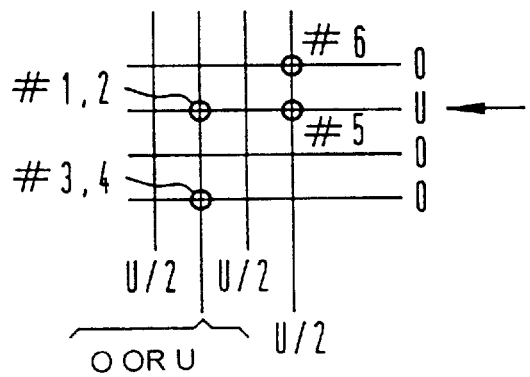
FIGS. 3A–3G are fragmentary, diagrammatic views used to explain the process of reading and writing a memory cell in the memory device according to the exemplary embodiment of the invention.
Figure 3B:
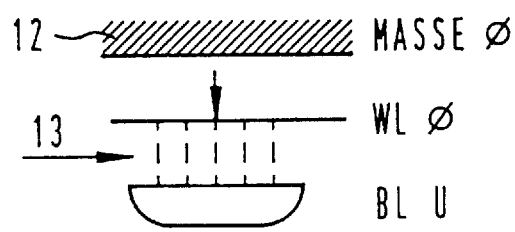
Figure 3E:
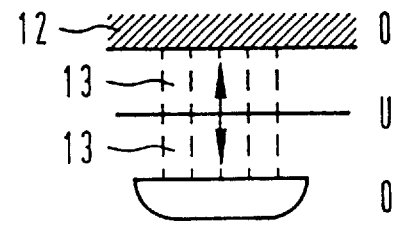
Figure 3C:
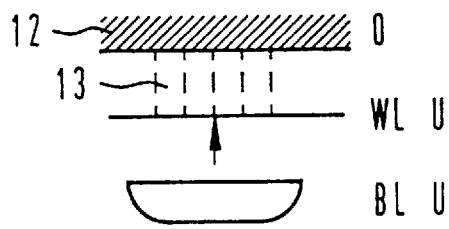
Figure 3F:
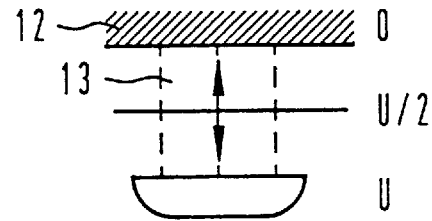
Figure 3D:
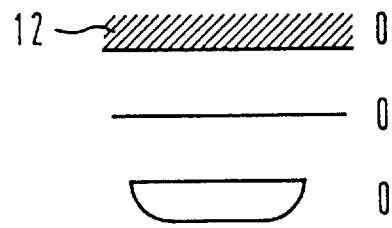
Figure 3G:
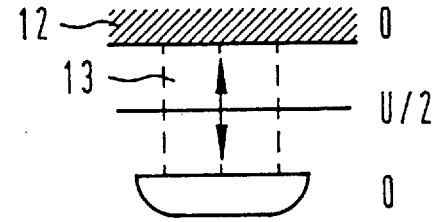

FIG. 3B is a diagrammatic view which shows case #1 of the selected memory cell, with force exerted downward, and FIG. 3C shows case #2 of the addressed memory cell, with force exerted upward. FIGS. 3D and 3E respectively show cases #3 and #4 of the memory cells on an active word line, and FIGS. 3F and 3G respectively show cases #5 with the memory cell at an active bit line and #6 of a memory cell at a nonactive word line and a nonactive bit line. Since all of the other cells except those addressed act as diodes, in fact only the current through the addressed cell will be measured.

The writing times can be estimated in a rough estimate on the order of magnitude of a few nsec. The described memory preserves the information even if the supply voltage fails and is therefore also distinguished by an extremely low standby current. If the upper wafer 7 is ground thin by an SOI technique that is known per se, then an SOI triggering logic can be easily integrated into this layer as well. A further possibility is to provide a triggering logic through the use of the methods of vacuum microelectronics ("microtubes"). Such a logic can be achieved under some circumstances at particularly little additional expense, since the emission cathode, a "grating" layer (the diaphragm), an anode (the ground plate) and the vacuum cavities are already present in the memory cell and thus require no additional production steps.

According to another exemplary embodiment, which is not shown in detail in the drawings, of a memory device according to the invention with many memory cells, which have a miniaturized mechanical element, the memory device may be constructed as an erasable compact disk. First, dimples are etched into a carrier or substrate. Next, a diaphragm is applied, for instance through the use of a recently developed wafer bonding process. In it, two wafers are placed on one another and glued together, and after that, one of the wafers is etched away.

In order to obtain further details of this so-called SOI technology, reference may be made to the article by W. P. Maszara entitled "Wafer Bonding: SOI, Generalized Bonding, and New Structures", in Microelectronic Engineering 22 (1993) 299–306, Elsevier Science Publishers B. V., which is hereby entirely incorporated by reference.

The diaphragm is assumed to be under a compressive stress. The fact that materials exist which already upon manufacture, for instance by sputtering, have a built-in stress can be taken into account. It can also be taken into account that with certain chemical reactions which are involved in a volumetric increase, a compressive stress can be produced. One known example of this is the oxidation of silicon. A comprehensive stress can also be produced by ion implantation. Finally, differences in the thermal expansion between the substrate and the diaphragm can also be utilized to develop a compressive stress (bonding at high temperature). The thus-produced diaphragms of the memory cells, which diaphragms are fastened on all sides, have two stable positions. First, the memory device is erased from outside by the exertion of a pressure, for instance with the aid of a pressure chamber or the like and an air stream at a pressure on the order of magnitude of 1 at. A writing operation can be carried out by purposefully heating individual memory cells through the use of a laser at a temperature of a few hundred degrees Celsius. The reading operation can be carried out, for instance, by detecting an interference between the diaphragm and the bottom of the dimple. The memory device made in this way, in the form of a compact disk, can be erased and rewritten. It is apparent from the above computational estimate that external acceleration from vibration and the like cannot in any case switch over the diaphragms.

We claim:

1. A memory device, comprising:

a substrate;

a multiplicity of memory cells disposed on said substrate for at least intermittent stable storage of at least two different information states;

a writing device associated with said memory cells for selectively putting one of said multiplicity of memory cells into a predetermined information state by external action; and a reading device associated with said memory cells for detection of an information state of a selected memory cell;

said memory cells having a miniaturized mechanical element with a micromechanical diaphragm being under a compressive stress; and said reading device associated with said memory cells having a field emissions point disposed at a given distance from said diaphragm.

2. A memory device, comprising:

a substrate;

a multiplicity of memory cells disposed on said substrate for at least intermittent stable storage of at least two different information states;

a writing device associated with said memory cells for selectively putting one of said multiplicity of memory cells into a predetermined information state by external action; and a reading device associated with said memory cells for detection of an information state of a selected memory cell;

said memory cells having a miniaturized mechanical element with a micromechanical diaphragm being under a compressive stress; and said diaphragm being under a pneumatic force acting upon said diaphragm for changing the information states from one to another.

3. The memory device according to claim 2, including a preferably gas-filled hollow chamber being closed on all sides, said diaphragm of said miniaturized mechanical element being disposed above said hollow chamber.

4. The memory device according to claim 3, wherein said hollow chamber is gas-filled.

5. The memory device according to claim 4, including a heater for heating a gas volume disposed in said gas-filled hollow chamber.

6. The memory device according to claim 3, including an erasing device for placing all of said memory cells into a predetermined stable state.

7. The memory device according to claim 6, wherein said erasing device is a pressure chamber.

8. A memory device, comprising:
a substrate;
a multiplicity of memory cells disposed on said substrate for at least intermittent stable storage of at least two different information states;
a writing device associated with said memory cells for selectively putting one of said multiplicity of memory cells into a predetermined information state by external action; and
a reading device associated with said memory cells for detection of an information state of a selected memory cell;
said memory cells having a miniaturized mechanical element with a micromechanical diaphragm being under a compressive stress, said reading device having a transistor with a control terminal forming said diaphragm; and
said reading device associated with said memory cells detects at least one of:
light interference of a beam of light between said diaphragm and a stationary surface, and
an interruption in a beam of light passing through said diaphragm.

9. A memory device, comprising:
a substrate;
a multiplicity of memory cells disposed on said substrate for at least intermittent stable storage of at least two different information states;
a writing device associated with said memory cells for selectively putting one of said multiplicity of memory cells into a predetermined information state by external action; and
a reading device associated with said memory cells for detection of an information state of a selected memory cell;
said memory cells having a miniaturized mechanical element with a micromechanical diaphragm being under a compressive stress; and
a micromirror associated with a beam of light of said diaphragm;
said reading device associated with said memory cells adjusting said micromirror.

10. The memory device according to claim 1, wherein said miniaturized mechanical element of said memory cell has different bistable states corresponding to the at least two information states to be stored in memory.

11. The memory device according to claim 2, wherein said miniaturized mechanical element of said memory cell has different bistable states corresponding to the at least two information states to be stored in memory.

12. The memory device according to claim 8, wherein said miniaturized mechanical element of said memory cell has different bistable states corresponding to the at least two information states to be stored in memory.

13. The memory device according to claim 9, wherein said miniaturized mechanical element of said memory cell has different bistable states corresponding to the at least two information states to be stored in memory.

14. The memory device according to claim 1, wherein said miniaturized mechanical element is produced micromechanically.

15. The memory device according to claim 2, wherein said miniaturized mechanical element is produced micromechanically.

16. The memory device according to claim 8, wherein said miniaturized mechanical element is produced micromechanically.

17. The memory device according to claim 9, wherein said miniaturized mechanical element is produced micromechanically.

18. The memory device according to claim 1, wherein said miniaturized mechanical element is produced microelectronically.

19. The memory device according to claim 2, wherein said miniaturized mechanical element is produced microelectronically.

20. The memory device according to claim 8, wherein said miniaturized mechanical element is produced microelectronically.

21. The memory device according to claim 9, wherein said miniaturized mechanical element is produced microelectronically.

22. The memory device according to claim 1, wherein flexing events of said micromechanical diaphragm correspond to the at least intermittent stable information states, and the flexing events can be converted into one another by the action of a force.

23. The memory device according to claim 2, wherein flexing events of said micromechanical diaphragm correspond to the at least intermittent stable information states, and the flexing events can be converted into one another by the action of a force.

24. The memory device according to claim 8, wherein flexing events of said micromechanical diaphragm correspond to the at least intermittent stable information states, and the flexing events can be converted into one another by the action of a force.

25. The memory device according to claim 9, wherein flexing events of said micromechanical diaphragm correspond to the at least intermittent stable information states, and the flexing events can be converted into one another by the action of a force.

26. The memory device according to claim 22, wherein the force acting on said diaphragm for converting the various information states to one another is an electrostatic force.

27. The memory device according to claim 23, wherein the force acting on said diaphragm for converting the various information states to one another is an electrostatic force.

28. The memory device according to claim 24, wherein the force acting on said diaphragm for converting the various information states to one another is an electrostatic force.

29. The memory device according to claim 25, wherein the force acting on said diaphragm for converting the various information states to one another is an electrostatic force.

30. The memory device according to claim 22, wherein the force acting on said diaphragm for converting the information states to one another is a magnetic force.

31. The memory device according to claim 23, wherein the force acting on said diaphragm for converting the information states to one another is a magnetic force.

32. The memory device according to claim 24, wherein the force acting on said diaphragm for converting the information states to one another is a magnetic force.

33. The memory device according to claim 25, wherein the force acting on said diaphragm for converting the information states to one another is a magnetic force.

34. The memory device according to claim 1, wherein said reading device has an electromechanical switch being switched by said diaphragm as a function of the states of said diaphragm.

35. The memory device according to claim 2, wherein said reading device has an electromechanical switch being switched by said diaphragm as a function of the states of said diaphragm.

36. The memory device according to claim 8, wherein said reading device has an electromechanical switch being switched by said diaphragm as a function of the states of said diaphragm.

37. The memory device according to claim 9, wherein said reading device has an electromechanical switch being switched by said diaphragm as a function of the states of said diaphragm.

38. The memory device according to claim 1, including a switch element associated with said diaphragm, said reading device being an electromechanical switch switched by said switch element as a function of the states of said diaphragm.

39. The memory device according to claim 2, including a switch element associated with said diaphragm, said reading device being an electromechanical switch switched by said switch element as a function of the states of said diaphragm.

40. The memory device according to claim 8, including a switch element associated with said diaphragm, said reading device being an electromechanical switch switched by said switch element as a function of the states of said diaphragm.

41. The memory device according to claim 9, including a switch element associated with said diaphragm, said reading device being an electromechanical switch switched by said switch element as a function of the states of said diaphragm.

42. The memory device according to claim 1, wherein said reading device detects an electrical capacitance between said diaphragm and a stationary surface.

43. The memory device according to claim 2, wherein said reading device detects an electrical capacitance between said diaphragm and a stationary surface.

44. The memory device according to claim 8, wherein said reading device detects an electrical capacitance between said diaphragm and a stationary surface.

45. The memory device according to claim 9, wherein said reading device detects an electrical capacitance between said diaphragm and a stationary surface.

46. The memory device according to claim 1, wherein said reading device associated with said memory cells has a transistor with a control terminal being associated with said diaphragm.

47. The memory device according to claim 2, wherein said reading device associated with said memory cells has a transistor with a control terminal being associated with said diaphragm.

48. The memory device according to claim 9, wherein said reading device associated with said memory cells has a transistor with a control terminal being associated with said diaphragm.

49. The memory device according to claim 1, wherein said reading device associated with said memory cells has a transistor with a control terminal forming said diaphragm.

50. The memory device according to claim 2, wherein said reading device associated with said memory cells has a transistor with a control terminal forming said diaphragm.

51. The memory device according to claim 9, wherein said reading device associated with said memory cells has a transistor with a control terminal forming said diaphragm.

52. The memory device according to claim 49, wherein said transistor has a conductivity being varied as a function of a spacing of said diaphragm from a main surface of said transistor.

53. The memory device according to claim 50, wherein said transistor has a conductivity being varied as a function of a spacing of said diaphragm from a main surface of said transistor.

54. The memory device according to claim 8, wherein said transistor has a conductivity being varied as a function of a spacing of said diaphragm from a main surface of said transistor.

55. The memory device according to claim 51, wherein said transistor has a conductivity being varied as a function of a spacing of said diaphragm from a main surface of said transistor.

56. A method for reading out data contents from memory cells of a memory device, the memory cells having a miniaturized mechanical element and being located at intersections of word lines and bit lines, which comprises:
  selecting one word line and one bit line; and
  measuring electrical resistance of the selected word line with respect to the selected bit line.

57. The method according to claim 56, which comprises carrying out the step of measuring the electrical resistance of the selected word line with respect to the selected bit line by comparing the measured electrical resistance with an electrical resistance of a reference memory cell having a predetermined switching state.

* * * * *